United States Patent
Houle et al.

(10) Patent No.: US 8,029,716 B2
(45) Date of Patent: Oct. 4, 2011

(54) AMORPHOUS NITRIDE RELEASE LAYERS FOR IMPRINT LITHOGRAPHY, AND METHOD OF USE

(75) Inventors: Frances A Houle, Fremont, CA (US); Christopher V. Jahnes, Upper Saddle River, NJ (US); Simone Raoux, Santa Clara, CA (US); Stephen M Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 12/024,985

(22) Filed: Feb. 1, 2008

(65) Prior Publication Data

US 2009/0194502 A1 Aug. 6, 2009

(51) Int. Cl.
*B28B 11/08* (2006.01)

(52) U.S. Cl. ........ 264/293; 264/496; 264/319; 264/338; 977/887

(58) Field of Classification Search .................. 264/293, 264/319, 338, 496; 977/887
See application file for complete search history.

(56) References Cited

U.S. PATENT DOCUMENTS

| | | | |
|---|---|---|---|
| 6,387,787 B1 | 5/2002 | Mancini et al. | |
| 6,533,968 B1 | 3/2003 | Feist et al. | |
| 6,852,454 B2 | 2/2005 | Mancini et al. | |
| 7,077,992 B2 | 7/2006 | Sreenivasan et al. | |
| 7,140,861 B2 | 11/2006 | Watts et al. | |
| 2002/0135099 A1 | 9/2002 | Robinson et al. | |
| 2002/0167117 A1 | 11/2002 | Chou | |
| 2004/0033424 A1 | 2/2004 | Talin et al. | |
| 2004/0124566 A1 | 7/2004 | Sreenivasan et al. | |
| 2004/0141163 A1 | 7/2004 | Bailey et al. | |
| 2005/0084804 A1 | 4/2005 | Truskett et al. | |
| 2005/0146079 A1* | 7/2005 | Chou ............................ | 264/319 |
| 2006/0144274 A1 | 7/2006 | Kolesnychenko et al. | |
| 2006/0144275 A1 | 7/2006 | Kolesnychenko et al. | |
| 2006/0222968 A1 | 10/2006 | Talin et al. | |
| 2006/0255505 A1* | 11/2006 | Sandhu et al. ................. | 264/293 |
| 2006/0264048 A1* | 11/2006 | Cabral et al. .................... | 438/687 |
| 2007/0048625 A1 | 3/2007 | Nordquist et al. | |

FOREIGN PATENT DOCUMENTS

| | | |
|---|---|---|
| WO | 96/34767 A1 | 11/1996 |
| WO | WO 2007029482 A1 | 3/2007 |
| WO | WO2007030528 A2 * | 3/2007 |

OTHER PUBLICATIONS

W. De La Cruz, O. Contretras, G. Soto, E. Perez-Tijerina; Cobalt Nitride Produced by Reactive Pulsed Laser Deposition; Sep. 2006; Revista Mexicana De Fisca; 52(5); pp. 409-412.*

(Continued)

*Primary Examiner* — Yogendra N Gupta
*Assistant Examiner* — Ninh V Le
(74) *Attorney, Agent, or Firm* — Daniel E. Johnson

(57) ABSTRACT

Amorphous inorganic nitrides are used as release layers on templates for nanoimprint lithography. Such a layer facilitates the release of a template from a cured, hardened composition into which the template has transferred a pattern, by reducing the adhesion energy between the release layer and the cured, hardened composition. The release layer may include one or more metallic or semiconductor elements such as Al, Mn, B, Co, Ti, Ta, W and Ge.

24 Claims, 5 Drawing Sheets

OTHER PUBLICATIONS

H. Scmidt, W. Gruber, T. Gutberlet, M. Ay, J. Stahn, U. Geckle, M. Bruns; Structural Relaxation and Self-diffusion in Covalent Amorphous Solids: Silicon Nitride As A Model System; Aug. 23, 2007; Journal of Applied Physics; vol. 102; pp. 1-6.*

Mahieu et al.; Mechanism of Preferential Orientation in Sputter Deposited Titanium Nitride and Yttria-Stabilized Zirconia Layers;2005;Journal of Crystal Growth;279;100-109.*

Komuro et al, "Improvement of Imprinted Pattern Uniformity Using Sapphire Mold", Jpn. J. Appl. Phys., Jun. 2002, pp. 4182-4185, Part 1, No. 6B, The Japan Society of Applied Physics, Japan.

Navabpour et al., "Evaluation of non-stick properties of magnetron-sputtered coatings for moulds used for the processing of polymers", Surface and Coatings Technology, 2006, pp. 3802-3809, vol. 201, Issue 6, UK (Abstract only).

"Release Agents & Lubricants", ESK Advanced Technical Ceramics, 2007 (Web page).

Altun et al., "Boron nitride stamp for ultra-violet nanoimprinting lithography fabricated by focused ion beam lithography", Nanotechnology, vol. 18, 2007, pp. 1-5, IOP Publishing, UK.

Houle et al., "Antiadhesion Considerations for UV Nanoimprint Lithography", Applied Physics Letters, 2007, 213103-1-213103-3, vol. 90, Issue 21, American Institute of Physics, USA.

C.A. Mills et al., "Production of structures for microfluidics using polymer imprint techniques", Microelectronic Engineering 78-79 (2005), pp. 695-700.

* cited by examiner

| Resist | Crosslinker | Monofunctional | Monofunctional | Photosensitizer/PAG |
|---|---|---|---|---|
| SiA | 1,3 butanediol diacrylate (15) | t-butyl acrylate (37) | SIA 0210.0 (44) | Darocur 4265 (4) |
| MC1 | Ethylene glycol diacrylate (55) | Isobornyl acrylate (27) | n-hexyl acrylate (15) | Darocur 1173 (3) |
| RS751 | mPSS (31.7) | Cyclohexyl methacrylate (63.5) | -- | Irgacure 819, Irgacure 184 (4.8) |
| VEB | Diethylene glycol divinyl ether (96.75) | -- | -- | CGI 1907 + 9-anthracenemethanol (3.25) |
| BnVE | Benzyl divinyl ether (96.75) | -- | -- | CGI 1907 + 9-anthracenemethanol (3.25) |

Compositions of test formulations (wt% in formulation)

FIG. 2

| Resist | TiN, sput 4.5sccm | TiN, sput 9sccm | TiN, sput 13.5sccm | TiN, ALD | TaNx | GeNx | WNx | CoNx | MnNx | AlNx | BNx | Fluorosilane |
|---|---|---|---|---|---|---|---|---|---|---|---|---|
| SiA | 0.54 | -- | -- | -- | 0.5 | 0.63 | -- | 0.08 | 0.28 | -- | 5.75 | 0.6 |
| MC1 | 3.78 | -- | -- | -- | 2.27 | -- | -- | -- | 2.01 | -- | -- | 1.13 |
| RS751 | 0.25 | -- | -- | -- | 0.17 | 0.26 | 1.03 | 0.07 | 0.22 | 1.43 | 0.65 | 0.57 |
| VEB | 3 | 3.2 | 3 | -- | Too high to test | -- | 5.42 | -- | -- | -- | -- | 5.6 |
| BnVE | 2.14 | 1.64 | 1.74 | 1.16 | | 6.96 | 4.74 | 0.22 | 0.31 | 0.57 | Too high to test | Too high to test |

Adhesion Energies for Selected Release Layers Under Dry Nitrogen, J/m²

FIG. 3

| Surface | C | N | O | F | S | Ti |
|---|---|---|---|---|---|---|
| TiN, 4.5sccm, virgin | 25.4 | 18.3 | 30.9 | 0 | 6 | 19.5 |
| TiN, ALD, virgin | 21.1 | 24.4 | 27.9 | 0 | 2.3 | 24.3 |
| TiN, debonded from MC1 | 21.8 | 23.6 | 29.1 | 0.1 | 1.8 | 23.6 |
| TiN, debonded from BnVE once | 19.9 | 23 | 28.3 | 3.6 | 1.9 | 23.3 |
| TiN, debonded from BnVE twice | 19.7 | 22.6 | 29.1 | 3.3 | 1.8 | 23.4 |
| TiN, debonded from RS751 | 26.5 | 21.7 | 27.5 | 0.1 | 1.9 | 22.3 |
| MC1 | 82.1 | 0 | 17.8 | 0.2 | 0 | 0 |
| BnVE | 80.5 | 0 | 18.1 | 1.3 | 0.1 | 0 |
| RS751 | 73.1 | 0 | 23.4 | 0 | 3.5 | 0 |

FIG. 4

X-Ray Photoemission Data, Showing Surface Compositions of TiN-Coated Si or Glass, and Compositions of Resists (Atomic %)

AMORPHOUS NITRIDE RELEASE LAYERS FOR IMPRINT LITHOGRAPHY, AND METHOD OF USE

TECHNICAL FIELD

The invention relates to release layers for templates used in imprint lithography, and more particularly, to layers that facilitate the releasing of templates from curable compositions used in step and flash nanoimprint lithography processes.

BACKGROUND

Imprint lithography has received attention as a possible alternative to conventional photolithography because of its ability to print small features at low cost. Step and flash imprint lithography is one kind of imprint lithography that is amenable to the resolution and overlay requirements necessary for the fabrication of advanced semiconductor devices. With step and flash imprint lithography, a photosensitive material is squeezed between a substrate and a mechanically rigid, ultraviolet (UV) transparent template having a relief pattern. The photosensitive material is then exposed to actinic radiation, causing it to cure in situ. The resulting cured, hardened layer, which has a pattern of features defined by the relief pattern, can be used as an etch mask to transfer this pattern into an underlying substrate.

Unfortunately, such a process is prone to a large number of defects, the primary sources of which are particles and cohesive failure of the cured material during debonding (see, for example, W. J. Dauksher et al., Proc. SPIE 6517, 651714, 2007). Cohesive failure occurs when the bond between the cured material and the template is stronger than the bonds within the cured material itself. For this reason, it is generally necessary to pre-coat the template with a release agent or coating, so that the template does not stick to the cured material. Unfortunately, release coatings are not necessarily effective and durable (see, for example, F. A. Houle et al., J. Vac. Sci. Technol. B 23, 2427, 2007). If a coating is ineffective, the cured material will become bonded to the coating as a result of the curing step, with the bond between the cured material and the coating being potentially as strong as, or even stronger than, what the bond would be between the cured material and the bare (uncoated) template surface. On the other hand, if a coating is not durable, its repeated contact (e.g., as in a step and repeat patterning process) with photosensitive material during the curing process will eventually result in its degradation. In both cases, patches of highly adhesive regions can eventually develop on the template surface to which the curable material can bind. These patches will create defects in the corresponding imprinted patterns, thus requiring the template to be either refurbished or discarded.

Fluorosilanes have been widely used as release agents, but tend to degrade over time when used with curable materials. Both an alkane silane film (specifically SAMLAY™ from Nippon Soda Co., Ltd, as reported by K. Kumazawa et al., Nanoprint Nanoimprint Technology Conference, San Francisco, 2006) and a diamond-like carbon film (see F. A. Houle et al., Appl. Phys. Lett. 90, 213103, 2007) have been shown to be as effective or even better than fluorosilanes when used with acrylate and methacrylate-based resists, respectively. However, diamond-like carbon does not work well with vinyl ether resists. All of these release agents are chemically vulnerable and subject to degradation with use.

Accordingly, there is a need in the art for improved release layers for templates used in step and flash imprint lithography.

SUMMARY OF THE INVENTION

One aspect of the invention is a method that includes imprinting a template onto a photocurable composition, in which the template has a patterned surface (e.g., a relief-patterned surface), and in which a release layer that is located at the patterned surface includes an amorphous inorganic nitride having a chemical composition that differs from that of the template. The release layer contacts the curable composition and thereby transfers a pattern into the curable composition. The composition is then cured while the amorphous nitride is in contact with the curable composition, thereby forming a cured, imprinted composition. The template is then removed from the cured, imprinted composition. The amorphous nitride is selected so that the adhesion energy of the cured, imprinted composition to the release layer is less than what the adhesion energy of the cured, imprinted composition to the template would be in the absence of the release layer. The method preferably includes directing ultraviolet radiation through the template, through the release layer, and onto the curable composition. A pattern may be transferred into an underlying substrate by etching through portions of the cured, imprinted composition and into that substrate. The curable composition may include at least one crosslinkable material and a photoinitiator, or it may include at least one crosslinkable material and a photoacid generator.

Another aspect of the invention is a method that includes coating a surface of a patterned template (e.g., a template having a relief pattern thereon) with a release layer that includes an amorphous inorganic nitride selected to reduce adhesion to a curable composition. The template is brought into proximity with a layer of the curable composition, so that the release layer imprints a pattern into the curable composition. Ultraviolet radiation is directed onto the curable composition, so that the curable composition is cured while it is in contact with the release layer, and the template is then moved away from the cured composition.

One implementation of the invention is an apparatus that includes a template having a surface that defines a pattern of features (e.g., a relief pattern), with at least some of the features having a characteristic dimension of between 5 nanometers and 1000 nanometers. The template is configured to be used in a nanoimprint lithography process, in which the pattern is imprinted onto a curable composition that upon exposure to ultraviolet radiation forms a cured composition. A release layer is in contact with the aforementioned surface, and the release layer includes an amorphous inorganic nitride. In a preferred embodiment, at least some of the features have a characteristic dimension of between 5 nanometers and 100 nanometers.

Another implementation of the invention is an apparatus that includes a template having a surface that defines a pattern of features (e.g., a relief pattern), with at least some of the features having a characteristic dimension of between 5 nanometers and 1000 nanometers. The template is configured to be used in a nanoimprint lithography process, in which the pattern is imprinted onto a curable composition that upon exposure to ultraviolet radiation forms a cured composition. A release layer at the surface includes an amorphous inorganic nitride having a chemical composition that differs from that of the template. The amorphous nitride includes at least one element selected from the group consisting of the elements of groups 4, 5, 6, 7, 8-10, 13, and 14 of the Periodic Table.

BRIEF DESCRIPTION OF THE DRAWINGS

FIG. 1, which includes

FIG. 2 presents compositions of test formulations used in demonstrating principles of the invention;

FIG. 3 presents adhesion energy measurements made for various amorphous nitride coatings in the presence of dry nitrogen; and FIG. 4 presents six sets of photoemission data for surfaces of various TiN release layers, as well as photoemission data for 3 different resist formulations.

DETAILED DESCRIPTION OF THE INVENTION

Release layers are disclosed herein that in the context of this invention are unreactive, mechanically durable, optically thin, and conformal. The preferred thickness of these layers is on the order of nanometers, so that they are suitable for nanoscale lithography. Furthermore, the adhesion energy of certain curable materials to certain ones of these release layers is nominally in the range of van der Waals interactions (0.1 $J/m^2$), thereby reducing the possibility of the cohesive failure problem discussed above. To this end, amorphous inorganic nitrides are disclosed as release layer materials for use with UV-curable compositions as part of a nanoimprint lithographic process. These nitride layers exhibit extremely weak interfaces with the UV-cured compositions. As used herein, a "nitride" is a stoichiometric or non-stoichiometric chemical composition that contains nitrogen and at least one other element. As used herein, inorganic refers to chemical compositions that are not hydrocarbons or their derivatives. The nitrides used herein are solids under imprint lithography operating conditions.

Process Overview

Figure 1A:
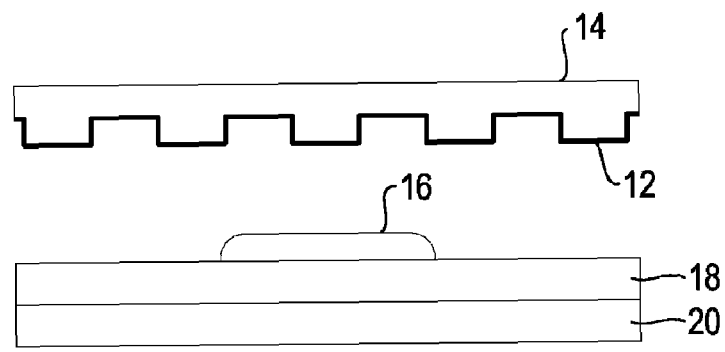
FIGS. 1A, 1B, 1C, 1D, 1E, 1F, and 1G, illustrates cross sectional views of an imprint lithography process that is one preferred implementation of the invention.

A variety of nanoimprint lithographic processes may be used in conjunction with the amorphous inorganic nitride release layers described herein, such as a multilayer stack process, a single curable layer process, and processes that utilize sacrificial and/or permanent layers. By way of example, exemplary implementations of the invention are now described with respect to FIG. 1, and in particular, with respect to a step and imprint lithography process, which may be carried out at room temperature. As shown in FIG. 1A, the method includes providing a rigid template 14 onto which a nitride release layer 12 (described in greater detail below) has been formed (e.g., deposited). The template 14 includes a patterned surface of features (represented schematically by the crenellated or notched pattern in FIG. 1A), at least some of which have a characteristic dimension (i.e., a width, length, height, diameter, etc.) on the order of nanometers. For example, at least some of the features have a characteristic dimension of between 5 and 1000 nanometers, and some may have a characteristic dimension of between 5 and 100 nanometers. As described below, these features are imprinted into photocurable material 16 and then transferred to another layer 18 that resides over a substrate 20.

The template 14 may be of $SiO_2$ (e.g., quartz or glass) or sapphire, for example, and may be formed previously in a separate process (not shown) by applying a layer of photoresist over a block of silica or sapphire, exposing the resist to a predetermined pattern of an e-beam or UV light, developing the image, and transferring the resulting developed image into the underlying block; alternatively, a focused ion beam may be used to form features directly into the block, thereby forming the template 14. The photocurable material 16 (which may be drop-coated, spin-coated, or otherwise dispensed onto the layer 18) may include at least one crosslinkable material and a photoacid generator (PAG), or alternatively at least one crosslinkable material and a photoinitiator. The to-be-patterned layer 18 is a patternable material (preferably an appropriate polymeric material), which may be deposited over the substrate 20. The substrate 20 may be made of Si, for example; it may itself be a previously patterned layer over which another layer of features is to be formed. In this manner, an entire electronic structure or device may be "built up" one layer at a time.

Figure 1B:
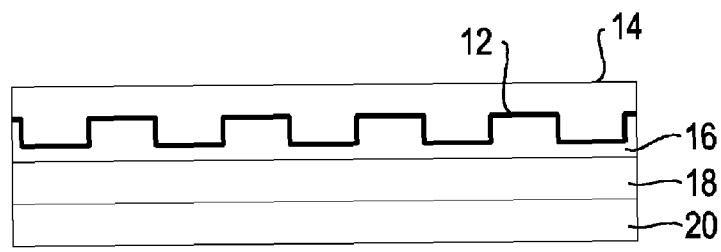

As shown in FIG. 1B, the pattern transfer process is implemented by squeezing the photocurable material 16 between the structure made up of the template 14/release layer 12 and the structure made up of the to-be-patterned layer 18/substrate 20. An imprinter apparatus (not shown) may be used that applies the required pressure. Before the components are brought together, the features of the template 14 may be aligned in a predetermined way with the layer 18/substrate 20. To this end, the imprinter apparatus may first utilize a coarse mechanical alignment step, so that the components are brought very nearly into the desired alignment. A subsequent alignment step relying on optical alignment techniques (such as those used with mask aligners, photolithography steppers, and scanners) may then be employed, so that the template 14 is brought into the desired alignment with the layer 18/substrate 20. This subsequent alignment step may make use of special alignment marks (not shown) in both the template 14 and the substrate 20, for example.

Figure 1C:
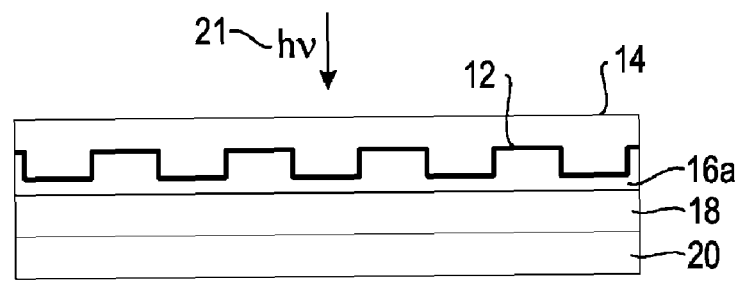

FIG. 1C shows the entire assembly when it is being held together tightly. At this stage, ultraviolet light 21 (such as that from a Hg lamp or a laser) is directed onto the photocurable composition 16, whereupon it is cured in situ into a hardened layer 16a. This ultraviolet light may be advantageously directed through the template 14, the release layer 12, and onto the photocurable composition 16. (Alternatively, if the underlying layer 18 and substrate 20 are UV-transparent, then UV light may be directed through them onto the photocurable composition 16.)

Figure 1D:
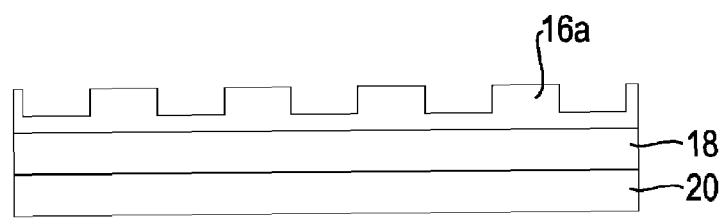

In FIG. 1D, the template 14 has been removed from the structure made up of the cured composition 16a/layer 18/substrate 20. The release layer 12 facilitates the separation of the template 14 from this structure, so that the cured composition 16a includes the (inverse of) features in the template 14—but without the defects (tears, pockets, etc.) that would have otherwise been introduced into the cured composition 16a if an unsuitable release layer were used. Likewise, the release layer 12 protects the integrity of the template 14 in the sense that cured material from the cured composition 16a does not readily attach itself to the release layer 12, thereby ensuring that the template 14 will stamp out the same pattern each time it is used.

Figure 1E:
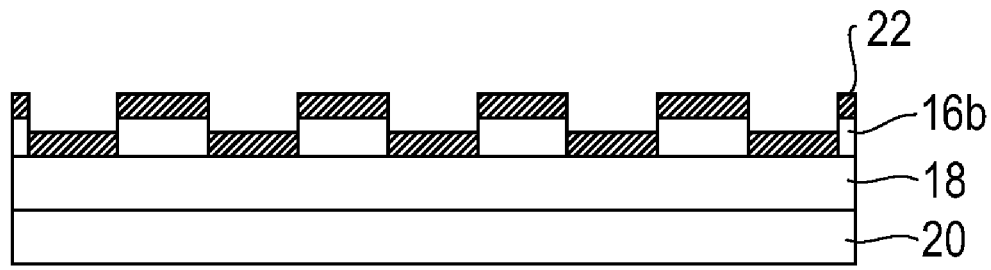
Figure 1F:
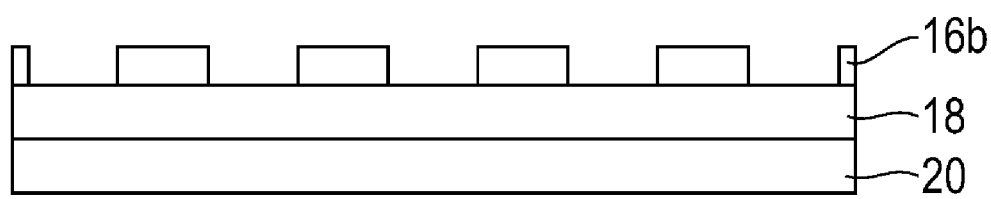
Figure 1G:
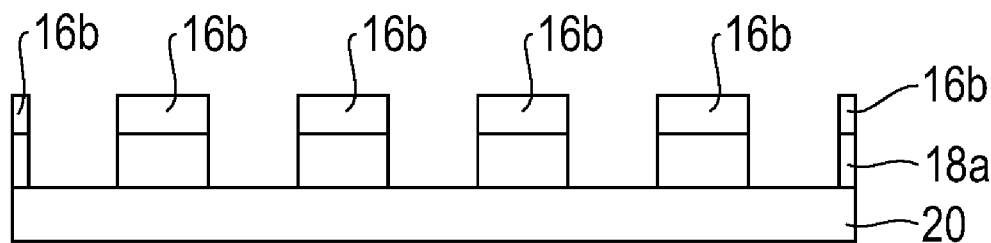

One specific continuation of the process shown in FIGS. 1A through 1D is now described with respect to FIGS. 1E through 1G. A breakthrough etch (e.g., an oxygen or halogen etch) is employed, as shown in FIG. 1E. In this step, portions 22 (indicated by the hatched regions) of the cured composition 16a are removed, leaving behind only portions of the cured composition 16a. These remaining portions are designated by the alphanumeric 16b in FIG. 1E. The resulting structure is shown in FIG. 1F, and shows that certain regions of the to-be-patterned layer 18 are now exposed, while others remain masked by the portions 16b of the cured composition.

As shown in FIG. 1G, another etch process (e.g., a reactive ion etch) then transfers the pattern of features into the layer 18, while exposing portions of the underlying substrate 20. This "transfer etch" step leaves behind only those portions 18a of the original layer 18 that are masked by the cured composition portions 16b. Thus, this etch process effectively amplifies the aspect ratio of the imprinted pattern.

Release Layer

The release layer 12 disclosed herein is advantageously a nitride, i.e., a composition that includes nitrogen and at least one other element; the chemical composition and/or structure of the release layer necessarily differs from that of the template 14 onto which it is coated. In particular, nitrides of Al (group 13 of the Periodic Table), Mn (group 7), Co (group 9, but which is representative of groups 8-10), B (group 13), Ti (group 4), Ta (group 5), W (group 6) and Ge (group 14) have been demonstrated to have desirable release characteristics. Accordingly, the nitride includes at least one element selected from the group consisting of the elements of groups 4, 5, 6, 7, 8-10, 13, and 14 of the Periodic Table. The nitride materials used for the release layer 12 are amorphous, since a crystalline release layer has been found by Applicants to work not nearly as well as an amorphous one (as discussed in Applicants' copending patent application Ser. No. 11/968,603 filed Jan. 2, 2008 and titled "Amorphous oxide release layers for imprint lithography, and method of use", which is hereby incorporated by reference). The nitrogen content of the nitride is preferably at least 5 atomic %, and may be up to 60 atomic %, for example. The nitrogen content of the composition may be stoichiometric.

A thin film of such a nitride is deposited onto the template 14 using, for example, plasma, vapor, or solution-based methods, or for example, the release layer may be formed in the template by ion implantation. In the Examples below, sputter deposition was used (resulting in films that were typically 3-10 nm thick), but any suitable deposition method that results in ultrathin, conformal, continuous, smooth films will work, e.g., an atomic layer deposition technique or chemical vapor deposition could also be used.

Silica, the material commonly used for UV-cure nanoimprint templates, usually adheres strongly to cured material. This adhesion is a result of strong chemical bonds, as well as a mechanically lossy polymer structure that resists debonding. The amorphous inorganic nitride release coatings disclosed herein evidently do not so easily form bonds that are involved in adhesion (e.g., siloxane bonds and hydrogen bonds).

EXAMPLES

All films used for adhesion tests were deposited on quartz bars, whereas witness films used for additional characterization were deposited on Si. TiN films were deposited by sputtering a Ti target in the presence of an argon/nitrogen mixture with 3 different nitrogen to argon ratios, and by atomic layer deposition. Ta nitride, Mn nitride and Co nitride were deposited by sputtering a Ta, Mn or Co target in an argon/nitrogen mixture with a nitrogen flow of 5 sccm and an argon flow of 40 sccm, and Al nitride was deposited by sputtering an Al target in an argon/nitrogen mixture with a nitrogen flow of 9 sccm and an argon flow of 40 sccm. W nitride and Ge nitride were deposited by sputtering a W or Ge target in an argon/nitrogen mixture with a nitrogen flow of 20 sccm and an argon flow of 40 sccm. A thin (3 nm) B nitride film was deposited from a BN target. (BN has a water contact angle of nearly 0° and is a very different material from the thick crystalline BN layer described by A. O. Altun et al. in Nanotechnology vol. 18, p. 465302, 2007.) The atomic layer deposition films (ALD) were deposited using sequential exposures of tetrakis-dimethylamino titanium (TDMAT) and a nitrogen plasma. The sputtered films were 3-10 nm thick, and the ALD film was about 2 nm thick. All were reasonably transparent near 365 nm: B nitride and Al nitride were completely transparent, Ti nitride and Co nitride attenuated the light by 20%, Ta nitride attenuated the light by 40%, W nitride and Mn nitride attenuated the light by about 60%, and Ge nitride attenuated the light by 47%. The attenuation can be reduced by making the film thinner, which would not impact the anti-adhesive properties. The sputtered and ALD Ti nitride films were atomically smooth as measured by atomic force microscopy (AFM).

FIG. 2 presents the various formulations used as the photocurable compositions in these measurements, along with their compositions. Specifically, the five different resist formulations below were used as the photocurable compositions, each of which is designated by the indicated alphanumeric:

"SiA"—a silicon-containing acrylate resist, which as indicated included 44 weight percent of SIA 0210.0 (3-acryloxypropyl)tris(trimethoxysiloxy)silane from Gelest, Inc.);

"MC1"—an all-organic acrylate;

"RS751"—a polyhedral oligomeric silsesquioxane methacrylate resist, which included 31.7 weight percent of mPSS (methacryl polyhedral oligomeric silsesquioxane);

"VEB"—a glycol vinyl ether based resist; and

"BnVE"—an aromatic vinyl ether based resist.

The various photosensitizers used in each of the resist formulations are also indicated, in which the following chemicals from the CIBA Corporation were used:

IRGACURE 819™: phenyl-bis(2,4,6-trimethyl benzoyl)-phosphine oxide;

IRGACURE 184™: 1-hydroxycyclohexylphenyl ketone;

DAROCUR 4265™: diphenyl-(2,4,6-trimethyl benzoyl)-phosphine oxide+2-hydroxy-2-methyl-1-phenyl-1-propanone;

Darocur 1173™: 2-hydroxy-2-methyl-1-phenyl-1-propanone; and

CGI 1907™: 2-[2,2,3,3,4,4,5,5-octafluoro-1-(nonafluorobutylsulfonyloxyimino)-pentyl]-fluorene.

The adhesion energies of Al, B, Co, Mn, Ti, Ta, W and Ge nitrides with several different resist formulations were measured at room temperature using a DTS Delaminator operated in double cantilever beam mode. Specimens were prepared using 2 bars, one silicon and one quartz, both 8 mm×65 mm. The quartz bar (representing the template 14, but having a substantially flat surface without any relief features) was precoated with the selected nitride (representing the release coating 12). The nitride films, which were deposited on respective quartz bars, had thicknesses ranging from about 2 to about 10 nm. Another structure (analogous to the structure given by the layer 18 and the substrate 20) was the silicon bar precoated with a selected adhesion promoter to ensure good attachment of cured material to it. Both bars had a tab epoxied at one end, which was attached to the non-coated side of the bar. The bars were placed in a glove box purged with dry nitrogen. 2-3 microliters of the selected curable resist (representing the photocurable composition 16) were dropped onto the adhesion-promoter-coated side of the silicon bar, then immediately covered with the quartz bar, allowing the nitride-coated side to be in contact with the resist composition. The resist was allowed to spread evenly. The sandwich structure was removed from the glove box and immediately irradiated with output from an Optical Associates, Inc. (OAI) mid-UV lamp for a preselected time, receiving a dose of 250-350 mJ/cm$^2$ depending on the resist used. The tabbed ends were fixed into the delaminator grips and debonding measurements commenced immediately after cure. The delaminator was placed in a purged enclosure allowing debonding to take place in dry nitrogen. The delaminator displacement rate was held constant at 2 microns/sec. Data were analyzed to obtain Gc (the critical energy release rate in J/m$^2$), which is a measure of adhesion strength, using conventional beam mechanics.

Adhesion energies measured with a dry nitrogen ambient are presented in FIG. 3 and compared with results using a fluorosilane release layer. For all but one resist (MC1), use of metal nitrides gave lower adhesion than the commonly used fluorosilanes. This is likely due to the specific chemistry of the metal nitrides selected: others would have to be tested to find the optimum metal or combination of metals for that particular resist. Adhesion was found to be slightly affected by the TiN composition, but the nature of the metal was by far the more important factor. Depending on the surface composition of the metal nitride film, it is possible that hydrolyzable chemical bonds could be formed between the resist and the release layer. If such bonds are formed, providing a humid atmosphere during debonding could facilitate the release process by assisting in bond breaking. The displacement rate used can also affect the adhesion energy, since debonding is a kinetic process. A value of 2 microns/sec is in the typical range of that used in nanoimprint tooling, although other displacement rates could also be more advantageous for particular nitride-resist combinations.

Note that there is a wide variability in the adhesion of the cured materials to the nitrides studied here, suggesting that to achieve optimum results, it may be necessary to select a specific nitride for use with a specific resist. For example, of the nitrides tested, TaNx and CoNx are best used with the RS751 resist (although Ge nitride, Mn nitride and Ti nitride would also be acceptable), whereas Co nitride and Mn nitride are best suited for use with the BnVE resist (although Al nitride would also be acceptable). Also, carefully controlling the debonding environment may also be advantageous for reducing adhesion, depending on the resist chemistry.

Chemical stability and composition sensitivity were examined for TiN. The data shown in FIG. 4 were obtained using the TiN samples studied in connection with FIG. 3. Although there are some small variations in the surface composition between the TiN samples, note that repeat measurements when using BnVE resist showed no change in adhesion and no further change after the first use, i.e., the composition of the surface of the TiN release layer did not significantly change between the first imprint and second imprint onto BnVE resist. Since metal nitrides may oxidize in air, the surfaces here may include metal oxynitrides with some adsorbed carbon. (For the TiN tests, TiN was deposited on either Si (for the "virgin" tests, in which the "as deposited" TiN material was studied to represent TiN that has never come into contact with resist material) or glass (for the debonding tests), and as a result it is believed that some Si diffused to the surface during film growth.)

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A method, comprising:
    imprinting a template onto a curable composition, wherein the template has a patterned surface, and wherein a release layer that is located at the patterned surface includes an amorphous inorganic nitride having a chemical composition that differs from that of the template, the amorphous nitride contacting the curable composition and thereby transferring a pattern into the curable composition, wherein the amorphous nitride includes at least one element selected from the group consisting of the element Ge, the elements of groups 4, 5, 6, 7, 8-10, and 13 of the IUPAC Periodic Table;
    photocuring the curable composition while the amorphous nitride is in contact with the curable composition, thereby forming a cured, imprinted composition; and
    removing the template from the cured, imprinted composition, the amorphous nitride being selected so that the adhesion energy of the cured, imprinted composition to the release layer is less than what the adhesion energy of the cured, imprinted composition to the template would be in the absence of the release layer.

2. The method of claim 1, wherein said photocuring includes directing ultraviolet radiation through the template, through the release layer, and onto the curable composition.

3. The method of claim 2, wherein the curable composition resides on a substrate, and the method comprises:
    etching through portions of the cured, imprinted composition and into the substrate, thereby transferring the pattern into the substrate.

4. The method of claim 3, wherein the release layer does not contact the substrate.

5. The method of claim 1, wherein the nitrogen content of the amorphous nitride is stoichiometric.

6. The method of claim 1, wherein the curable composition includes a crosslinkable material and a photoinitiator.

7. The method of claim 1, wherein the curable composition includes a crosslinkable material and a photoacid generator.

8. The method of claim 1, wherein the nitrogen content of the release layer is between 5 and 60 atomic %.

9. The method of claim 1, wherein the amorphous nitride includes at least one element selected from the group consisting of Ti, Ta, W, Ge, Al, Mn, Co, and B.

10. The method of claim 1, wherein the amorphous nitride includes Ti.

11. The method of claim 1, wherein the amorphous nitride includes Ta.

12. The method of claim 1, wherein the amorphous nitride includes W.

13. The method of claim 1, wherein the amorphous nitride includes Ge.

14. The method of claim 1, wherein the amorphous nitride includes Al.

15. The method of claim 1, wherein the amorphous nitride includes Mn.

16. The method of claim 1, wherein the amorphous nitride includes Co.

17. The method of claim 1, wherein the amorphous nitride includes B.

18. The method of claim 1, wherein the release layer has a thickness of less than 10 nanometers.

19. A method, comprising:
    coating a surface of a patterned template with a release layer that includes an amorphous inorganic nitride selected to reduce adhesion to a curable composition, wherein the amorphous nitride includes at least one element selected from the group consisting of Ti, Ta, W, Ge, Al, Mn, Co, and B;

bringing the template into proximity with a layer of the curable composition, so that the amorphous nitride imprints a pattern into the curable composition;

directing ultraviolet radiation onto the curable composition, so that the curable composition is cured while it is in contact with the release layer; and removing the template away from the cured composition.

20. The method of claim 19, wherein the curable composition resides on a substrate, and the method comprises:

etching through portions of the cured, imprinted composition and into the substrate, thereby transferring the pattern into the substrate.

21. The method of claim 19, wherein the nitrogen content of the amorphous nitride is stoichiometric.

22. The method of claim 19, wherein the nitrogen content of the release layer is between 5 and 60 atomic %.

23. The method of claim 19, wherein the amorphous nitride includes Co.

24. The method of claim 19, wherein the release layer has a thickness of less than 10 nanometers.

* * * * *